United States Patent
Rossi

(10) Patent No.: US 7,579,885 B2
(45) Date of Patent: *Aug. 25, 2009

(54) CHARGE RECYCLING AMPLIFIER FOR A HIGH DYNAMIC RANGE CMOS IMAGER

(75) Inventor: Giuseppe Rossi, Pasadena, CA (US)

(73) Assignee: Aptina Imaging Corporation, Grand Cayman (KY)

( * ) Notice: Subject to any disclaimer, the term of this patent is extended or adjusted under 35 U.S.C. 154(b) by 568 days.

This patent is subject to a terminal disclaimer.

(21) Appl. No.: 11/235,100

(22) Filed: Sep. 27, 2005

(65) Prior Publication Data

US 2006/0017828 A1   Jan. 26, 2006

Related U.S. Application Data

(63) Continuation of application No. 10/866,705, filed on Jun. 15, 2004, now Pat. No. 6,967,509, which is a continuation of application No. 10/222,788, filed on Aug. 19, 2002, now Pat. No. 6,791,378.

(51) Int. Cl.
   *H03F 1/02* (2006.01)
(52) U.S. Cl. .......................................... 327/124; 330/9
(58) Field of Classification Search ............. 327/90–94, 327/124, 95, 554; 330/9, 69, 86, 141; 358/448; 348/300, 301

See application file for complete search history.

(56) References Cited

U.S. PATENT DOCUMENTS

| | | | |
|---|---|---|---|
| 4,806,874 A | 2/1989 | Michel | |
| 5,363,055 A | 11/1994 | Ribner | |
| 5,574,457 A | 11/1996 | Garrity et al. | |
| 5,594,445 A | 1/1997 | Genetti | |
| 6,097,326 A | 8/2000 | Opris et al. | |
| 6,169,427 B1 | 1/2001 | Brandt | |
| 6,339,363 B1 | 1/2002 | Fowler | |
| 6,351,283 B1 * | 2/2002 | Liu | 348/301 |
| 6,661,283 B1 | 12/2003 | Lee | |
| 6,791,378 B2 * | 9/2004 | Rossi | 327/124 |
| 6,821,808 B2 * | 11/2004 | Nakamura et al. | 438/57 |
| 6,885,396 B1 * | 4/2005 | Panicacci et al. | 348/241 |
| 6,919,551 B2 * | 7/2005 | Barna et al. | 250/214 R |
| 6,967,509 B2 * | 11/2005 | Rossi | 327/124 |
| 7,199,654 B1 * | 4/2007 | Luo et al. | 330/9 |
| 7,208,983 B2 * | 4/2007 | Imaizumi et al. | 327/94 |

\* cited by examiner

*Primary Examiner*—Dinh T. Le
(74) *Attorney, Agent, or Firm*—Dickstein Shapiro LLP

(57) ABSTRACT

A high dynamic range amplifier circuit for amplifying pixel signals of an imager device is disclosed. The amplifier circuit uses a read-out scheme based on a charge recycling approach, where a pixel signal is first amplified with a low gain during a first amplification phase T1, and then the amplifier output is immediately recycled and the pixel signal amplified with a higher gain during a second amplification phase T2.

15 Claims, 10 Drawing Sheets

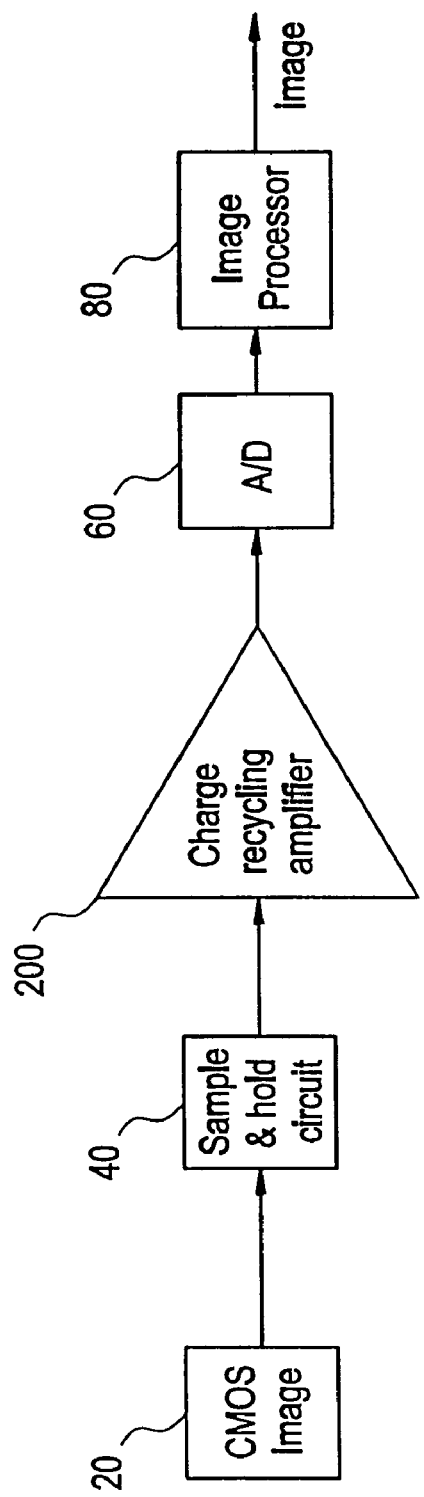

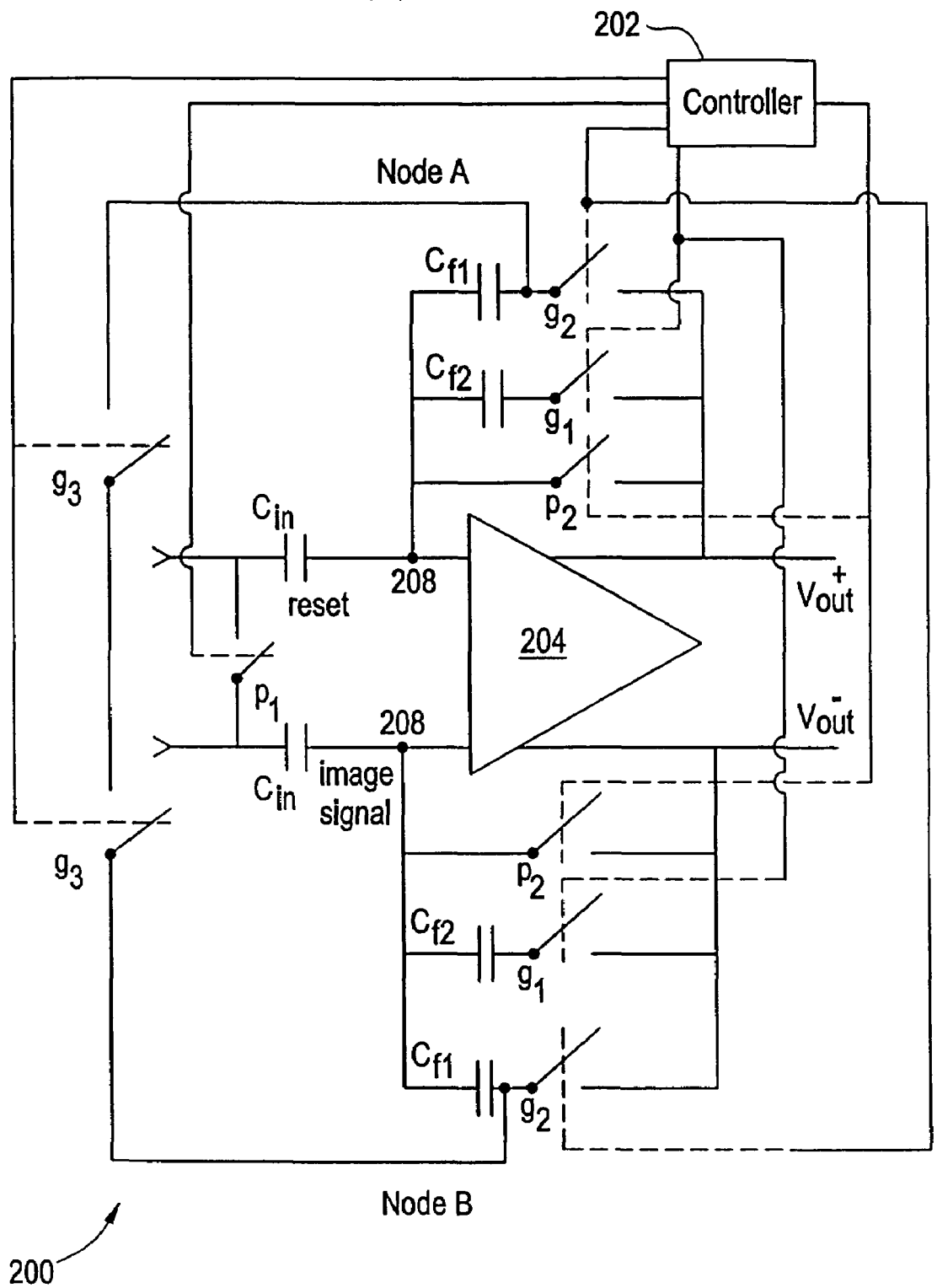

(start of $T_1$, low gain, switch pair $p_2$ opened)

CHARGE RECYCLING AMPLIFIER FOR A HIGH DYNAMIC RANGE CMOS IMAGER

This application is a continuation application of Ser. No. 10/866,705, filed Jun. 15, 2004 now U.S. Pat. No. 6,967,509, which is a continuation of Ser. No. 10/222,788, filed Aug. 19, 2002 now U.S. Pat. No. 6,791,378, the subject matter of which are incorporated by reference herein.

FIELD OF THE INVENTION

The invention relates to a charge recycling amplifier within a CMOS imaging device having improved dynamic range.

BACKGROUND OF THE INVENTION

One technique to increase dynamic range of a CMOS active pixel imager is to amplify pixel signals using two separate signal gains. The first applied gain is usually smaller than the second. The two amplified pixel signals are later combined together to produce the actual pixel output signal.

Since the currently adopted column parallel architecture uses a destructive read-out scheme, multiple exposures of the CMOS imager pixel array are required to capture pixel signals for each of the applied gain values. Sampling multiple exposures is a time consuming process, limiting the speed of image capture.

BRIEF SUMMARY OF THE INVENTION

The invention provides a charge recycling amplifier for use in a CMOS imaging device so that only one exposure of the array is required while still producing a pixel signal subject to two different gain values. The charge recycling amplifier comprises a differential amplifier; a pair of input capacitors connected to the inputs of the differential amplifier; first and second pairs of feedback capacitors where each are connected between the input and output of the differential amplifier; a crowbar switch for forcing a charge present on the input capacitors through the differential amplifier; and first and second pairs of gain switches connected to the first and second pairs of feedback capacitors respectively, for setting the gain of the charge recycling amplifier and at least one switch for recycling output charge on a pair of feedback capacitors back to the input of the differential amplifier. A pixel signal presented to the amplifier is first amplified with a first gain setting and then the amplified signal is amplified again with a second gain setting.

In yet another aspect of the invention, a method of operating the above components is disclosed.

These and other features and advantages of the invention will be more clearly seen from the following detailed description which is provided in connection with the accompanying drawings.

BRIEF DESCRIPTION OF THE DRAWINGS

FIG. 1 shows a simplified block diagram of a CMOS imaging device containing a charge recycling amplifier in accordance with the present invention;

FIG. 2 shows a schematic diagram of the charge recycling amplifier of FIG. 1;

DETAILED DESCRIPTION OF THE INVENTION

The present invention provides a dual gain system based on a charge recycling approach, to eliminate the need for obtaining two pixel signals from the array. With the present invention, the signal charge is first amplified at low gain during an initial amplification phase T1, and then the same charge is immediately re-used or recycled within an amplifier for a high gain amplification which occurs during phase T2. This approach eliminates the need to resample the pixel signal and reset the amplifier between the two signal gains. Since the high gain signal is readily available at the clock cycle following the low gain amplification, a considerable speed advantage occurs. Also, implementing the present invention requires only minimal variations to currently used pixel read-out schemes.

FIG. 1 shows a block diagram of a CMOS imaging device that uses the fully differential charge recycling analog amplifier in accordance with the present invention. In FIG. 1, a CMOS image search array 20 passes pixel reset and image signals from rows of pixels in the array connected to a column line to a sample and hold circuit 40, which in turn is connected to the charge recycling amplifier (CRA) 200. The CRA 200 passes image information to an analog/digital converter 60, which in turn passes digital information to an image processor 80, which then outputs signals representing a digitized image.

Figure 5:
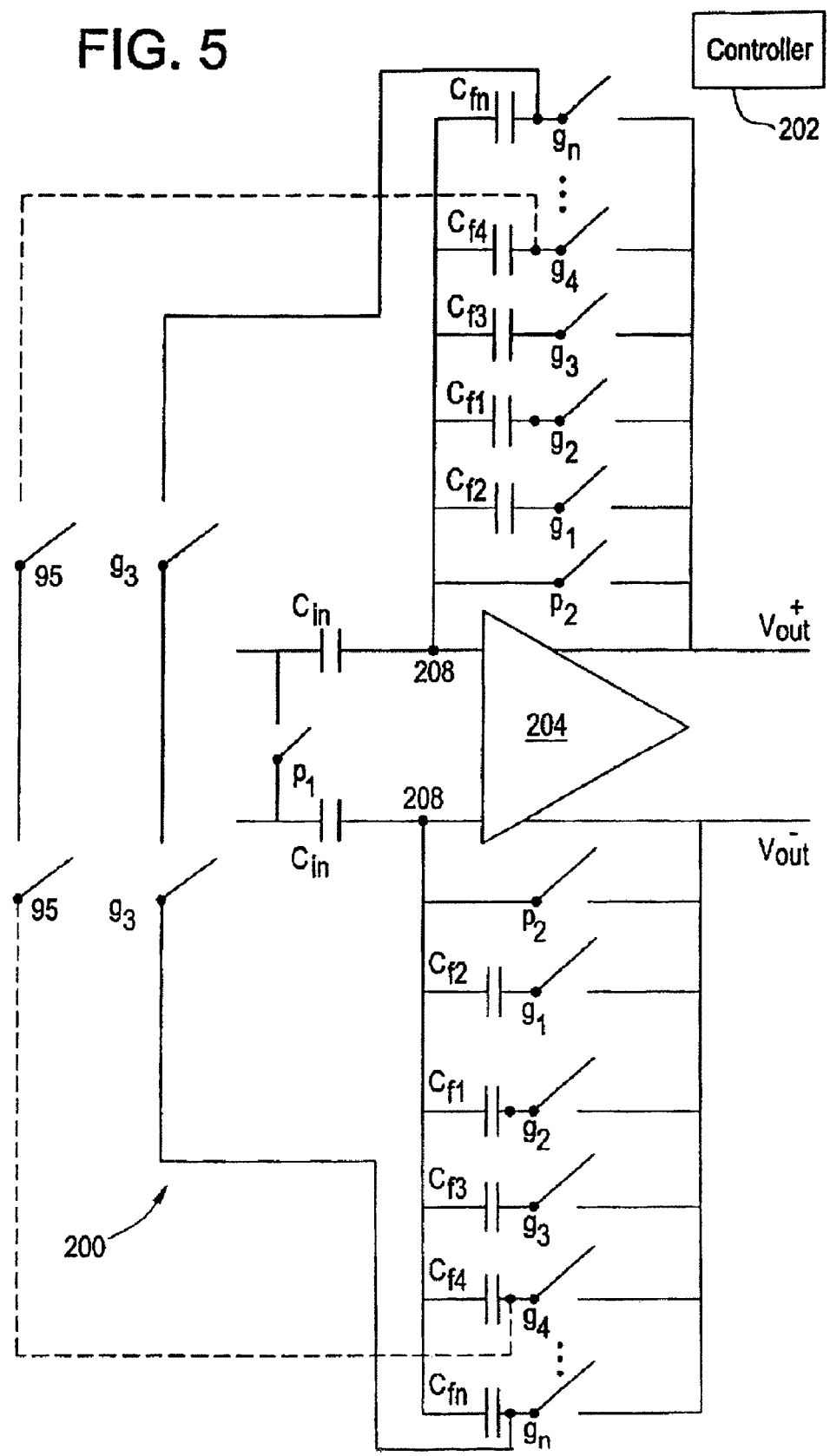
FIG. 5 shows an alternative embodiment of the charge recycling amplifier of FIG. 1.

FIG. 2 is a schematic diagram of the CRA 200. It includes a fully differential charge mode amplifier 204 having input capacitors Cin on the input path and a crowbar switch p1 for coupling together the input sides of the input capacitor cin. The appropriate gain of the CRA 200 (low and high) is selected by switch pairs g1 and g2 responsive to a controller 202. The switch pair g1 is always operated simultaneously, as is the switch pair g2. For simplicity, FIG. 2 shows only two separate pairs of feedback capacitors Cf1 and Cf2, although additional pairs could be added as shown in FIG. 5 and described below. An additional set of serially connected switches g3 is connected across Nodes A and B. The switches g3 are fabricated as a pair of simultaneous switches rather than single switch to maintain circuit balance and reduce the amount of current leakage during the charge recycling process, and are used to force charge stored across the feedback capacitors Cf1 back into the input nodes 208 of the charge mode amplifier 204 during a second stage of amplification. Reset switches p2 are provided in the amplifier feedback path to reset the differential amplifier 204 between charge sampling operation. All switches are responsive to output control signals from the controller 202.

It is important to note that the upper half of the CRA 200 is fabricated to be as symmetrical as possible with its lower half. In other words, for the CRA to operate properly, the upper capacitor Cf1 must equal the lower capacitor Cf1, the upper capacitor Cf2 must equal the lower capacitor Cf2, and the upper input capacitor Cin must equal the lower input capacitor Cin. Henceforth all references to these elements will be understood to apply to the pair of elements and not to a single element.

The gain of the CRA 200 is determined by a ratio of the input capacitor Cin to the feedback capacitance. Since the feedback capacitance can be changed by selectively switching Cf1 and Cf2 in circuit, gain can likewise be changed.

Figure 2A:
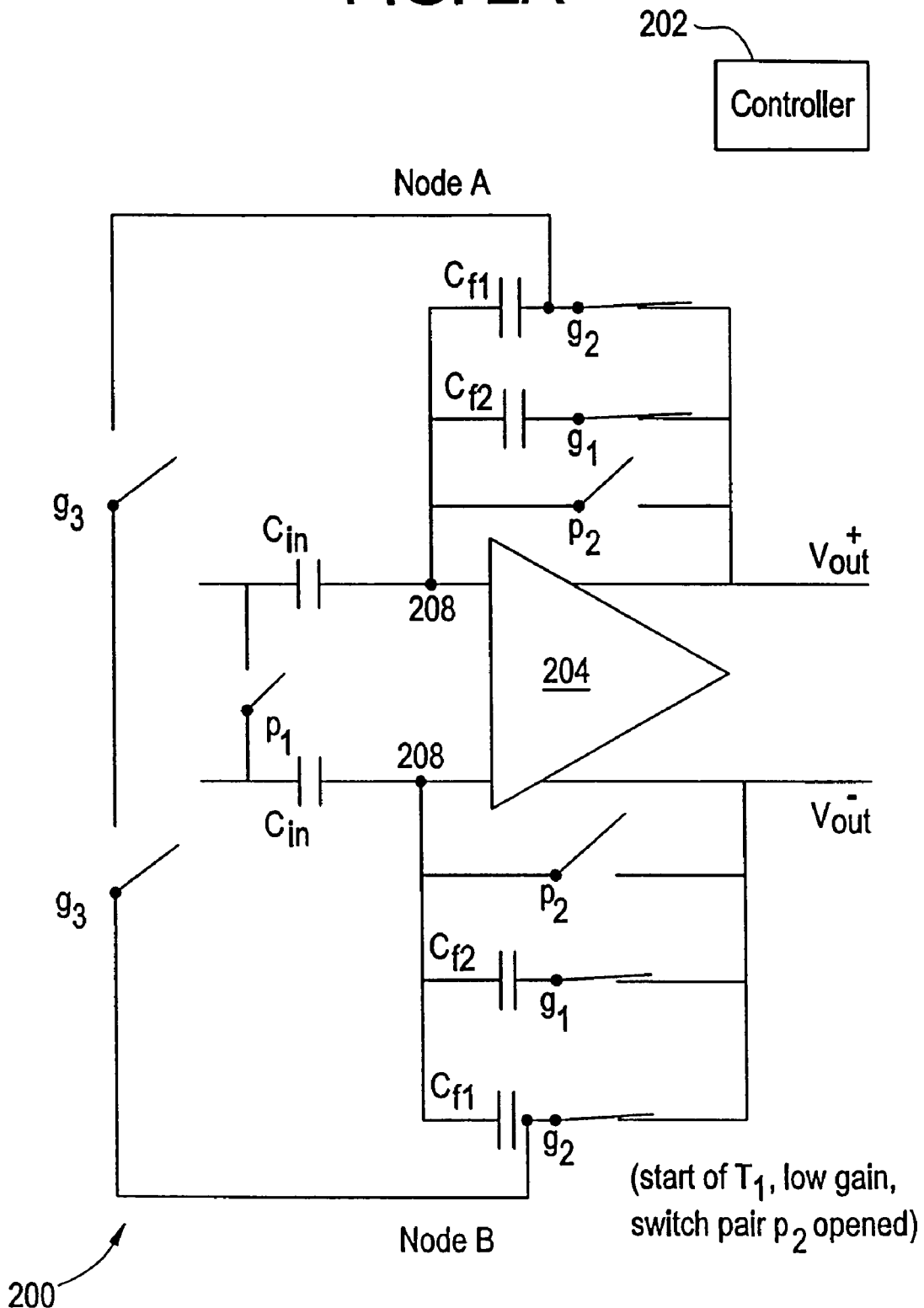
FIG. 2A shows the present invention at a first time during the charge-recycling process.
Figure 3:
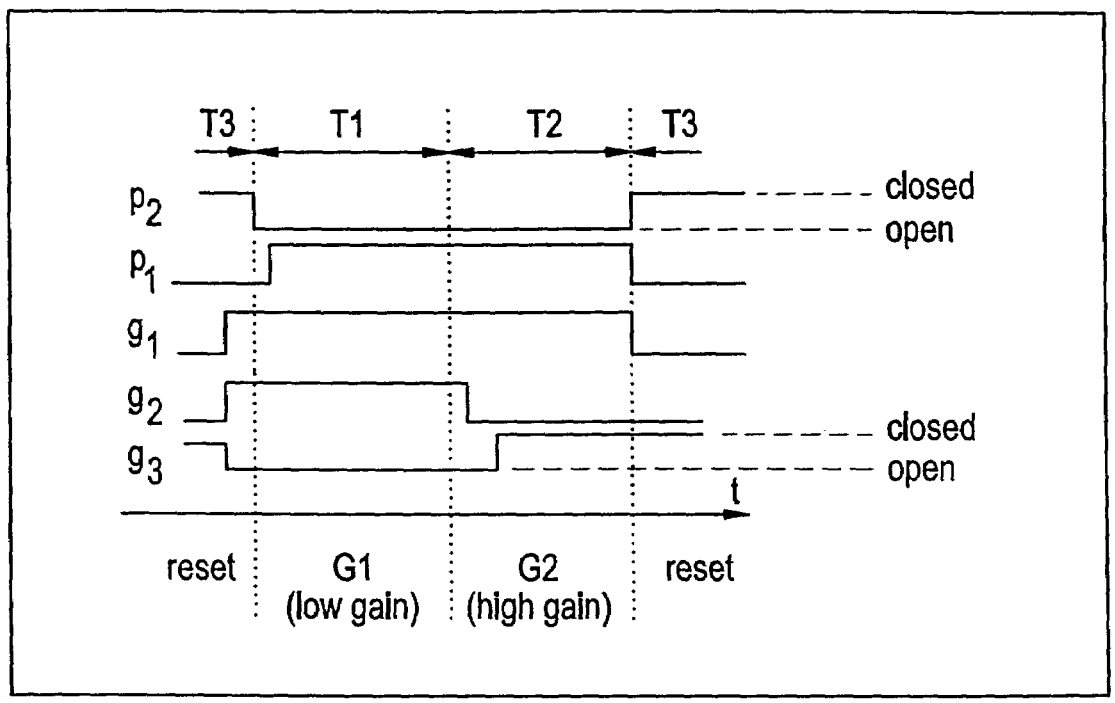
FIG. 3 shows a timing diagram for the circuit of FIG. 2.

A timing diagram depicting the operation of the CRA 200 is shown in FIG. 3, where T1 has a duration of exactly one clock cycle, as does T2. At the beginning of the time period T1, the reset switch p2 is opened, while the gain switches g1 and g2 remain closed, as shown in FIG. 2A. This corresponds to a low gain phase of operation denoted as T1. During the low gain operational phase T1, the gain of the amplifier 200 is:

$$\text{Gain1} = Cin/(Cf1+Cf2) \qquad (1)$$

Figure 2B:
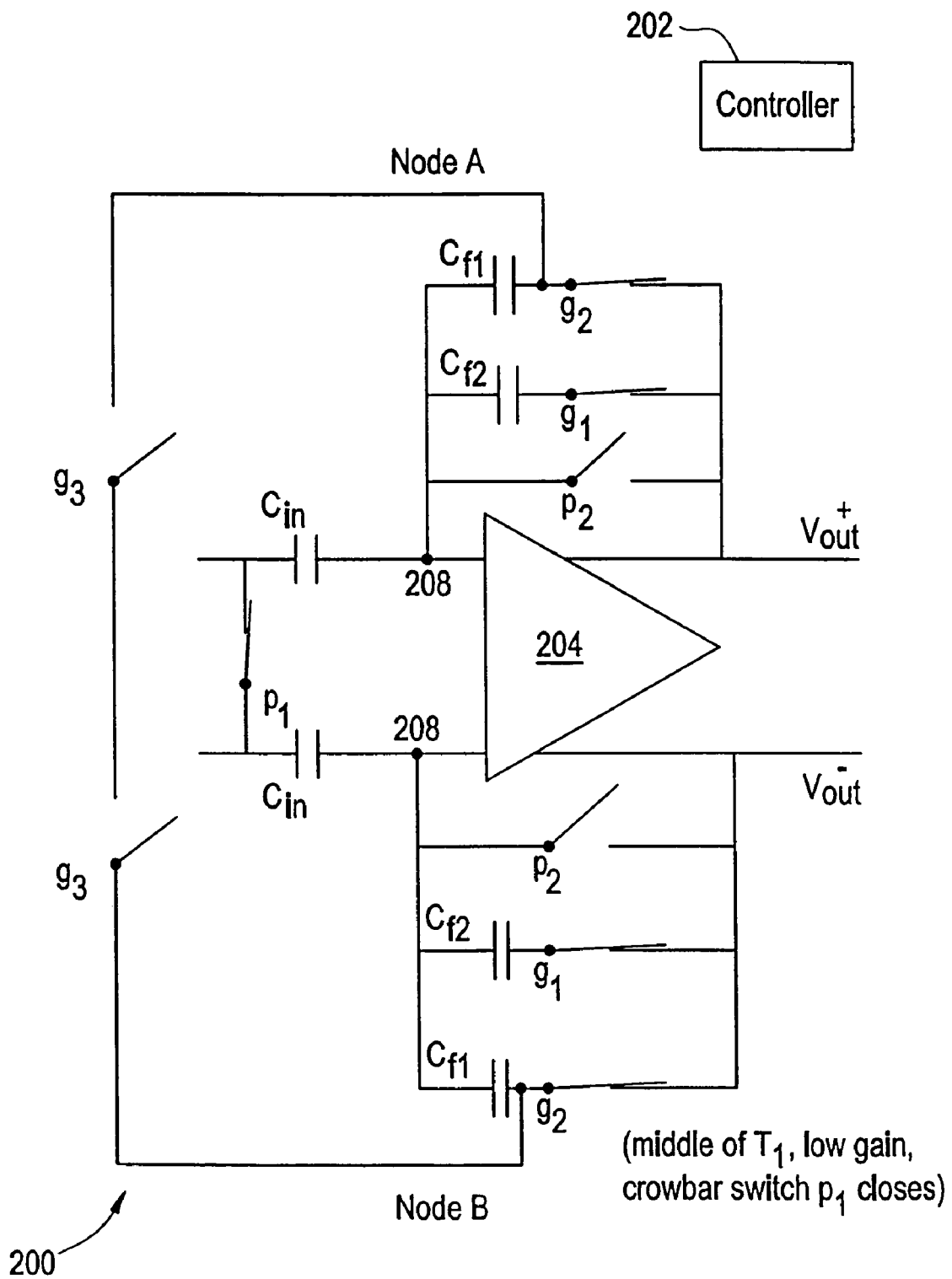
FIG. 2B shows the present invention at a second time during the charge-recycling process.
Figure 2C:
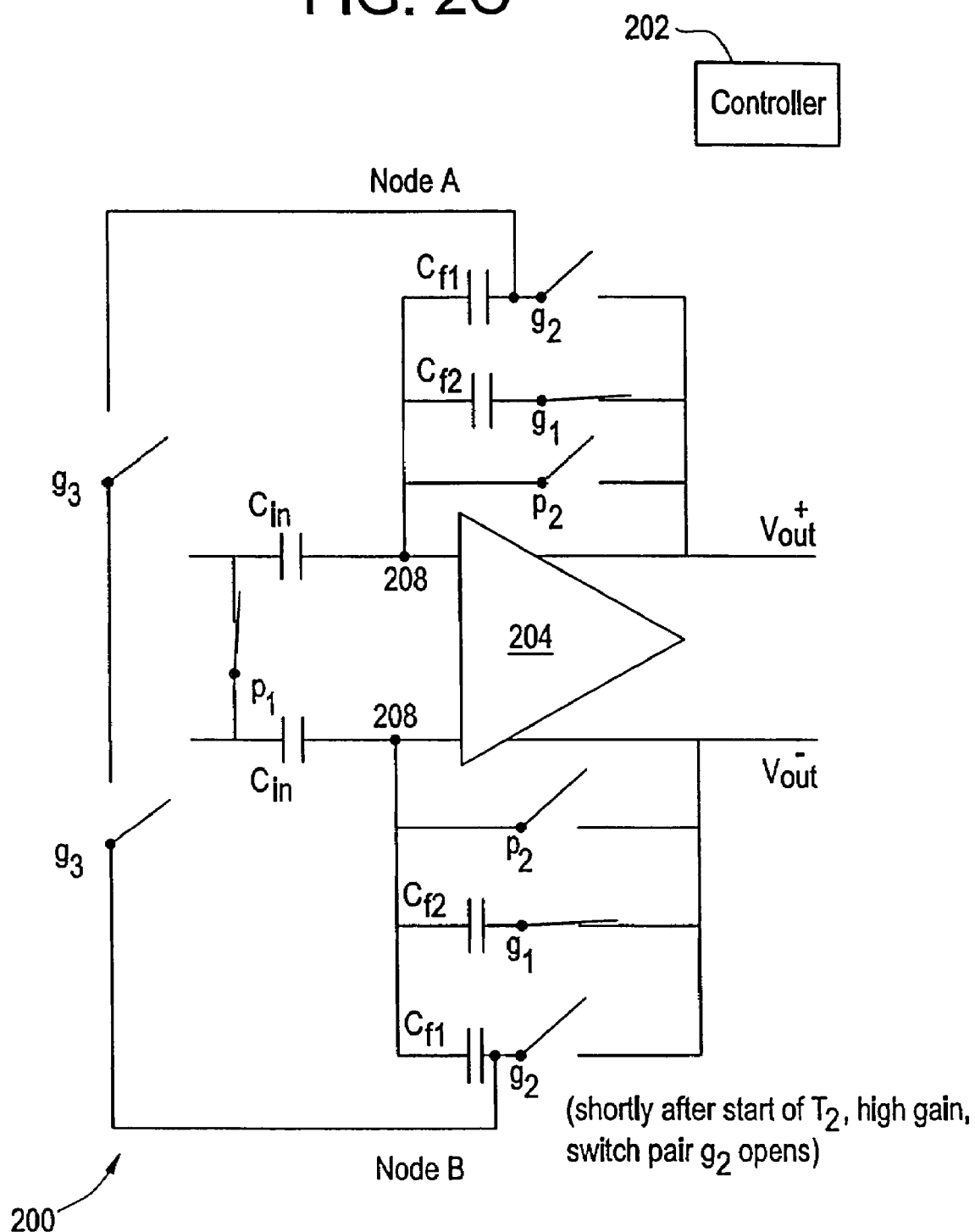
FIG. 2C shows the present invention at a third time during the charge-recycling process.

Shortly after the beginning of the lower gain amplification phase T1, as shown in FIG. 2B the crowbar switch p1 is closed so that pixel reset and image signal charges previously respectively sampled onto the input capacitors Cin is driven into the amplifier circuit. The reset and image signals are received by the differential amplifier 204 and amplified at the output nodes Vout+ and Vout−. Just before the end of the first lower gain amplification phase T1, the output signal of the CRA 200 settles within the desired accuracy and is read out to the analog to digital converter 60.

At the onset of the second (higher gain) amplification phase T2, the gain select switches g2 are opened (FIG. 2C), which puts the amplifier into high-gain mode since the gain of the amplifier now becomes:

$$\text{Gain2} = Cin/Cf2 \qquad (2)$$

Figure 2D:
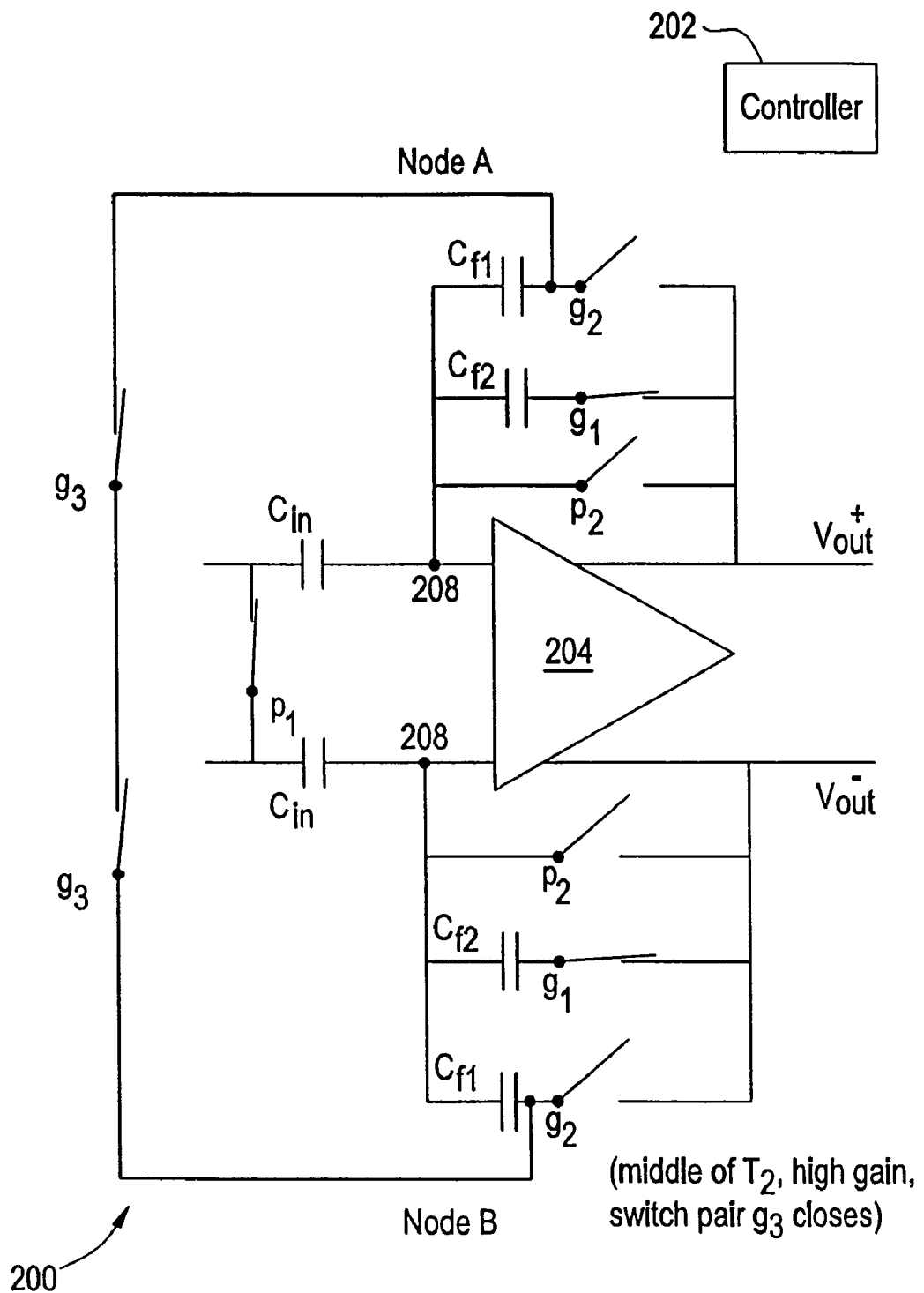
FIG. 2D shows the present invention at a fourth time during the charge-recycling process.

During the amplification phase T2, a voltage Vav is created at node A and node B of the CRA 200. Vav is the common mode voltage of the signal which corresponds to the output signal of the CRA output lines Vout− and Vout+. Applying a voltage Vav while the pair of switches g2 is opened causes the charge stored on the capacitors Cf1 to flow back into the input nodes 208 of the differential amplifier 204. That charge is thus recycled for use in the higher gain amplification phase T2. The best way to force the nodes A and B to the common mode voltage Av which is forced back through amplifier 204 is by shorting them together through the pair of switches g3, as shown in FIG. 2D. By closing the switches g3, the average voltage value generated is $$Vav = (Vout- + Vout+)/2 \qquad (3)$$

which corresponds to a common mode voltage signal. Closing the switches g3 forces the CRA 200 to recycle the charge sampled on the feedback capacitors Cf1. During the higher gain amplification phase T2, only the incremental amount of charge stored across the capacitors Cf1 is redistributed into the input node 208 of the differential amplifier 204. This has the advantage of increasing the speed of operation of the CRA 200.

Figure 2E:
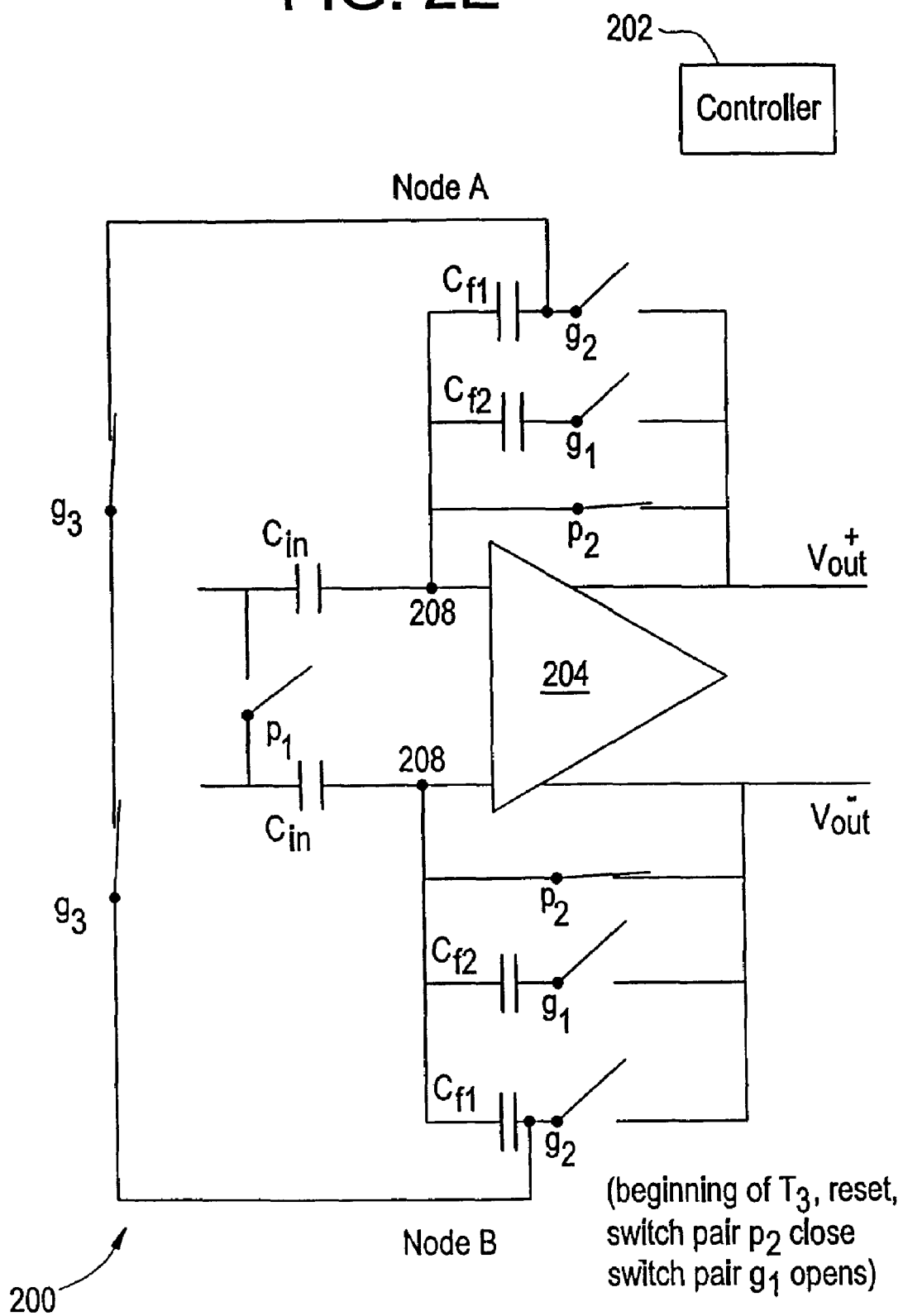
FIG. 2E shows the present invention at a fifth time during the charge-recycling process.

Just before end of the second higher gain amplification phase T2, the output signal of the CRA 200 has settled within the desired accuracy and is read out. At the end of the phase T2, which coincides with the beginning of the reset phase T3, the switch pair g1 is opened and the differential amplifier 204 is reset by closing the pair of switches p2 as shown in FIG. 2E.

This provides a differential pixel output signal at Vout+ and Vout1 which has a higher gain than the pixel output signal produced during the T1 phase.

Because of this recycling, it is not necessary to reacquire pixel data on the input capacitors Cin. Instead, charge information present on the capacitors Cf1 can be reused, so that only a single exposure of the CMOS imager 20 (FIG. 1) is necessary. Thus, the CRA 200 accomplishes a non-destructive readout of the originally applied pixel signal while providing sequential outputs of the differentially amplified pixel reset and image signals first at a lower and then at a higher gain. The read-out is termed non-destructive because the reset and image signals on the capacitors $C_{IN}$ is not lost after the first amplification stage, but is instead recycled.

Figure 4:
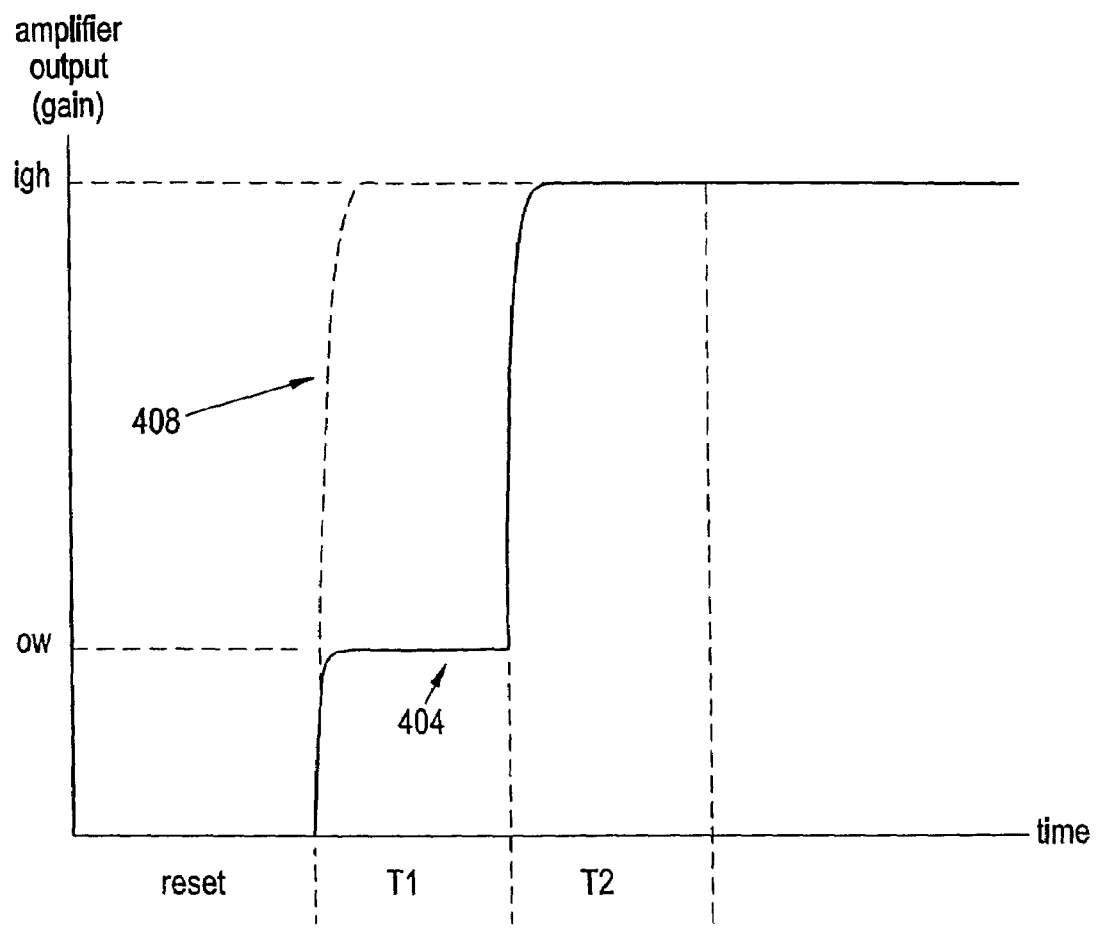
FIG. 4 contrasts a simulation output of the present invention with the output of a conventional non-recycling charge amplifier.

FIG. 4 contrasts a simulation output 404 of the CRA 200 of the present invention with a higher gain output 408 of a non-recycling charge amplifier output of the prior art. The output 404 of the CRA 200 reaches its quiescent point in two stages T1 and T2, while the output 408 of the non-recycling amplifier reaches its quiescent point in a single stage. However, from FIG. 4 it is apparent that the two signals 404 and 408 end up being duplicates of each other after time period T2. Accordingly, no unwanted artifacting nor loss of charge occurs when using the CRA of the present invention.

The charge recycling technique of the present invention can be expanded by adding more pairs of feedback capacitors Cf3, Cf4 . . . Cfn as shown in FIG. 5 to allow for different selection of gain values during the T1 phase in accordance with equation (1) above whereby the capacitance values of the capacitor switched in circuit during the T1 phase set the value of the denominator.

In addition, the FIG. 5 amplifier can be further modified as shown by doted lines to permit further recycling in a third phase T3 by using the voltage on a pair of capacitors Cf4 existing after the second phase T2. Thus, the charge on the capacitors can then be recycled following stage T1 through in successive stages T2 and T3. In such an arrangement, each phase would have an increasingly higher charge gain. This technique can also be repeated for additional stages, e.g. T4, etc.; however, once the output voltage of the differential amplifier 204 reaches its saturation, a considerably higher gain error is introduced, the inverting node 208 of the amplifier 204 is no longer at virtual ground, and no more meaningful charge recycling can be expected. Accordingly, this sets a limit on the number of gain stages T1, T2, T3 etc., which can be used.

Because of charge recycling, it is not necessary to reacquire pixel data on the input capacitor Cin. Instead, charge information present on the capacitors Cf1 can be re-used, so that only a signal exposure of the CMOS imager 20 (FIG. 1) is necessary. Thus the CRA 200 accomplishes a non-destructive readout of the originally applied pixel signal while providing sequential output of the amplified pixel signal first at a lower and then at a higher gain.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. An imager comprising:
an array of pixels outputting pixel signals; and
an amplifier for processing said output pixel signals comprising:
a first circuit for storing a set of pixel input signals as a set of initial charges;
a second circuit, said second circuit comprising:
an amplification device, coupled to said first circuit; and
a switching circuit, coupled to said amplification device;

wherein said switching circuit can be configured to be in
- a first state which causes said amplification device to output a first output signal by amplifying, with a first gain, an intermediate signal received from said initial charges stored in said first circuit,
- a second state which causes said second circuit to restore said initial charges in said first circuit, and
- a third state which causes said amplification device to output a second output signal by amplifying, with a second gain, said intermediate signal.

2. The imager of claim 1, wherein said amplifier further comprises:
a controller, coupled to said second circuit, for setting said switching circuit into said first, second, and third states.

3. The imager of claim 2, wherein said controller is configured to set said switching circuit into said first state before setting said switching circuit into said second state.

4. The imager of claim 3, wherein said controller is configured to set said switching circuit into said second state before setting said switching circuit into said third state.

5. The imager of claim 1, wherein said second gain is greater than said first gain.

6. The imager of claim 3, wherein said controller is configured to reset said amplification device before said switching circuit is set to said first state.

7. The imager of claim 6, wherein said controller is configured to reset said amplification device after said switching circuit is set to said third state.

8. The imager of claim 7, wherein said controller is configured to not reset said amplification device between said first and third states of said switching circuit.

9. The imager of claim 1, wherein said amplification device is a differential amplifier.

10. An imager comprising:
an array of pixels outputting pixel signals; and
a charge recycling amplifier for processing said output pixel signals comprising:
- a differential amplifier;
- a pair of input capacitors connected to the inputs of said differential amplifier for receiving a charge from said pixel signals;
- first and second pairs of feedback capacitors, each connected between the input and output of said differential amplifier; and
- a switching circuit coupled to said amplifier and capacitors for causing said differential amplifier to amplify initial signals based on said charge from said input capacitors with a first gain during a first amplification phase, recycle charge to said pair of input capacitors as recycled charge after said first amplification phase, and after said recycle, amplify subsequent signals associated with said recycled charge with a second gain during a second amplification phase.

11. The imager of claim 10, wherein said switching circuit comprises:
- a crowbar switch, arranged to switchably couple a same side of said pair of input capacitors, for forcing a charge present on said input capacitors through said differential amplifier;
- first and second pairs of gain switches, connected to said first and second pairs of feedback capacitors, respectively, for setting the gain of said charge recycling amplifier during said first and second amplification phases; and
- at least one switch, coupled to at least one of the pairs of feedback capacitors, for recycling charge from at least one of the pairs of feedback capacitors to the inputs of said differential amplifiers.

12. The imager of claim 10, wherein said charge recycling amplifier further comprises:
a reset switch connected between the inputs and outputs of said differential amplifier, for resetting said differential amplifier.

13. The imager of claim 10, wherein said at least one switch comprises a pair of serially connected switches.

14. The imager of claim 11, wherein said charge recycling amplifier further comprises:
- a third pair of feedback capacitors connected to the input and output of said differential amplifier; and
- a third pair of gain switches connected to said third pair of feedback capacitors for setting a gain of said differential amplifier during at least one of said first and second phases.

15. An imager comprising:
an array of pixels outputting pixel signals; and
a charge recycling amplifier coupled to said for processing said pixel signals comprising:
- an amplifier having at least one input and at least one output;
- at least one input capacitor connected to said at least one amplifier input and operative to receive a signal to be amplified;
- a capacitor feedback circuit coupled between said at least one input and said at least one output of said amplifier;
- a first switch circuit, coupled to said capacitor feedback circuit, for changing the capacitance value of said capacitor feedback circuit;
- a second switch circuit, coupled to each of said at least one input capacitor, for passing charge on said at least one input capacitor to said at least one input for amplification by said amplifier;
- a third switch circuit for coupling a charge from said capacitor feedback circuit to the input of said amplifier;
- a fourth switch circuit, coupled to said capacitor feedback circuit and said at least one input of said amplifier, for passing charge in said feedback circuit to said at least one input of said amplifier; and
- a control circuit for operating said first, second, third and fourth switch circuits such that a charge initially on said at least one input capacitor is amplified with a first gain value and output, and thereafter the charge initially on said at least one input capacitor is amplified with a second gain value higher than the first gain value and output.

* * * * *

UNITED STATES PATENT AND TRADEMARK OFFICE
CERTIFICATE OF CORRECTION

PATENT NO. : 7,579,885 B2 Page 1 of 1
APPLICATION NO. : 11/235100
DATED : August 25, 2009
INVENTOR(S) : Giuseppe Rossi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 900 days.

Signed and Sealed this

Fourteenth Day of September, 2010

David J. Kappos
*Director of the United States Patent and Trademark Office*